(12) United States Patent
Choi et al.

(10) Patent No.: US 12,361,986 B2
(45) Date of Patent: Jul. 15, 2025

(54) SEMICONDUCTOR DEVICE AND OPERATING METHOD WITH PAGE BUFFER INCLUDING LATCHES

(71) Applicant: SK hynix Inc., Gyeonggi-do (KR)

(72) Inventors: Hyung Jin Choi, Gyeonggi-do (KR); In Gon Yang, Gyeonggi-do (KR); Young Seung Yoo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 139 days.

(21) Appl. No.: 18/324,164

(22) Filed: May 26, 2023

(65) Prior Publication Data
US 2024/0274167 A1  Aug. 15, 2024

(30) Foreign Application Priority Data
Feb. 13, 2023  (KR) ........................ 10-2023-0018626

(51) Int. Cl.
*G11C 7/10* (2006.01)
(52) U.S. Cl.
CPC .......... *G11C 7/1084* (2013.01); *G11C 7/1087* (2013.01); *G11C 2207/101* (2013.01)
(58) Field of Classification Search
CPC ... G11C 7/1084; G11C 7/1087; G11C 7/1006; G11C 7/106; G11C 7/1057; G11C 2207/101; G11C 8/10; G11C 16/10
See application file for complete search history.

(56) References Cited

U.S. PATENT DOCUMENTS

| | | | |
|---|---|---|---|
| 10,910,044 B2 | 2/2021 | Yabe et al. | |
| 2012/0155168 A1* | 6/2012 | Kim | G11C 5/14 365/185.23 |
| 2013/0117620 A1* | 5/2013 | Joo | G11C 16/3418 714/E11.023 |

FOREIGN PATENT DOCUMENTS

KR  10-2149770 B1  8/2020

* cited by examiner

*Primary Examiner* — Sultana Begum
(74) *Attorney, Agent, or Firm* — IP & T GROUP LLP

(57) ABSTRACT

A semiconductor device may include a page buffer comprising first to fifth latches, wherein the first to third latches and the fifth latch are configured to store 4-bit original data, among 5-bit original data, respectively, and the fourth latch is configured to store data identical with the data that has been stored in the second latch and a control circuit configured to determine a program inhibition pattern based on data that have been stored in two of the first to fifth latches and control the page buffer so that data that has been stored in at least one of the first to fifth latches is inverted based on the program inhibition pattern.

22 Claims, 13 Drawing Sheets

FIG. 3

| | | | |
|---|---|---|---|
| ◖ Even Plug Cell (CSB_0) | | ⋀ | ⋀ |
| ◖ Odd Plug Cell (CSB_1) | | ⋀ | ⋀ |
| Data Level | | 0 / 1 | 0 / 1 |
| Coding Data | | 0 (Coding O) | 1 (Coding X) |

FIG. 4A

| LSB | CSB | MSB | PSB | QSB |
|---|---|---|---|---|
| 0 | 0 | 0 | 0 | 0 |
| 0 | 0 | 0 | 0 | 1 |
| 0 | 0 | 0 | 1 | 0 |
| 0 | 0 | 0 | 1 | 1 |
| 0 | 1 | 0 | 0 | 0 |
| 0 | 1 | 0 | 0 | 1 |
| 0 | 1 | 0 | 1 | 0 |
| 0 | 1 | 0 | 1 | 1 |
| 1 | 0 | 0 | 0 | 0 |
| 1 | 0 | 0 | 0 | 1 |
| 1 | 0 | 0 | 1 | 0 |
| 1 | 0 | 0 | 1 | 1 |
| 1 | 1 | 0 | 0 | 0 |
| 1 | 1 | 0 | 0 | 1 |
| 1 | 1 | 0 | 1 | 0 |
| 1 | 1 | 0 | 1 | 1 |
| 0 | 0 | 1 | 0 | 0 |
| 0 | 0 | 1 | 0 | 1 |
| 0 | 0 | 1 | 1 | 0 |
| 0 | 0 | 1 | 1 | 1 |
| 0 | 1 | 1 | 0 | 0 |
| 0 | 1 | 1 | 0 | 1 |
| 0 | 1 | 1 | 1 | 0 |
| 0 | 1 | 1 | 1 | 1 |
| 1 | 0 | 1 | 0 | 0 |
| 1 | 0 | 1 | 0 | 1 |
| 1 | 0 | 1 | 1 | 0 |
| 1 | 0 | 1 | 1 | 1 |
| 1 | 1 | 1 | 0 | 0 |
| 1 | 1 | 1 | 0 | 1 |
| 1 | 1 | 1 | 1 | 0 |
| 1 | 1 | 1 | 1 | 1 |

FIG. 4B

| LSB | CSB_0 | MSB | PSB | CSB_1 | QSB |
|---|---|---|---|---|---|
| 0 | 0 | 0 | 0 | 0 | 0 |
| 0 | 0 | 0 | 0 | 0 | 1 |
| 0 | 0 | 0 | 1 | 0 | 0 |
| 0 | 0 | 0 | 1 | 0 | 1 |
| 0 | 1 | 0 | 0 | 1 | 0 |
| 0 | 1 | 0 | 0 | 1 | 1 |
| 0 | 1 | 0 | 1 | 1 | 0 |
| 0 | 1 | 0 | 1 | 1 | 1 |
| 1 | 0 | 0 | 0 | 0 | 0 |
| 1 | 0 | 0 | 0 | 0 | 1 |
| 1 | 0 | 0 | 1 | 0 | 0 |
| 1 | 0 | 0 | 1 | 0 | 1 |
| 1 | 1 | 0 | 0 | 1 | 0 |
| 1 | 1 | 0 | 0 | 1 | 1 |
| 1 | 1 | 0 | 1 | 1 | 0 |
| 1 | 1 | 0 | 1 | 1 | 1 |
| 0 | 0 | 1 | 0 | 0 | 0 |
| 0 | 0 | 1 | 0 | 0 | 1 |
| 0 | 0 | 1 | 1 | 0 | 0 |
| 0 | 0 | 1 | 1 | 0 | 1 |
| 0 | 1 | 1 | 0 | 1 | 0 |
| 0 | 1 | 1 | 0 | 1 | 1 |
| 0 | 1 | 1 | 1 | 1 | 0 |
| 0 | 1 | 1 | 1 | 1 | 1 |
| 1 | 0 | 1 | 0 | 0 | 0 |
| 1 | 0 | 1 | 0 | 0 | 1 |
| 1 | 0 | 1 | 1 | 0 | 0 |
| 1 | 0 | 1 | 1 | 0 | 1 |
| 1 | 1 | 1 | 0 | 1 | 0 |
| 1 | 1 | 1 | 0 | 1 | 1 |
| 1 | 1 | 1 | 1 | 1 | 0 |
| 1 | 1 | 1 | 1 | 1 | 1 |

FIG. 4C

| LSB | CSB_0 | MSB | PSB | CSB_1 | QSB |
|---|---|---|---|---|---|
| 0 | 1 | 1 | 0 | 0 | 1 |
| 0 | 0 | 1 | 0 | 1 | 0 |
| 0 | 1 | 1 | 1 | 0 | 1 |
| 0 | 0 | 1 | 1 | 1 | 0 |
| 0 | 1 | 0 | 0 | 1 | 0 |
| 0 | 1 | 0 | 0 | 1 | 1 |
| 0 | 1 | 0 | 1 | 1 | 0 |
| 0 | 1 | 0 | 1 | 1 | 1 |
| 1 | 1 | 1 | 0 | 0 | 1 |
| 1 | 0 | 1 | 0 | 1 | 0 |
| 1 | 1 | 1 | 1 | 0 | 1 |
| 1 | 0 | 1 | 1 | 1 | 0 |
| 1 | 1 | 0 | 0 | 1 | 0 |
| 1 | 1 | 0 | 0 | 1 | 1 |
| 1 | 1 | 0 | 1 | 1 | 0 |
| 1 | 1 | 0 | 1 | 1 | 1 |
| 0 | 1 | 0 | 0 | 0 | 1 |
| 0 | 0 | 1 | 0 | 0 | 1 |
| 0 | 1 | 0 | 1 | 0 | 1 |
| 0 | 0 | 1 | 1 | 0 | 1 |
| 0 | 1 | 1 | 0 | 1 | 0 |
| 0 | 1 | 1 | 0 | 1 | 1 |
| 0 | 1 | 1 | 1 | 1 | 0 |
| 0 | 1 | 1 | 1 | 1 | 1 |
| 1 | 1 | 0 | 0 | 0 | 1 |
| 1 | 0 | 1 | 0 | 0 | 1 |
| 1 | 1 | 0 | 1 | 0 | 1 |
| 1 | 0 | 1 | 1 | 0 | 1 |
| 1 | 1 | 1 | 0 | 1 | 0 |
| 1 | 1 | 1 | 0 | 1 | 1 |
| 1 | 1 | 1 | 1 | 1 | 0 |
| 1 | 1 | 1 | 1 | 1 | 1 |

FIG. 7A

| LSB | CSB | MSB | PSB | QSB |
|---|---|---|---|---|
| 0 | 0 | 0 | 0 | 0 |
| 0 | 0 | 0 | 0 | 1 |
| 0 | 0 | 0 | 1 | 0 |
| 0 | 0 | 0 | 1 | 1 |
| 0 | 1 | 0 | 0 | 0 |
| 0 | 1 | 0 | 0 | 1 |
| 0 | 1 | 0 | 1 | 0 |
| 0 | 1 | 0 | 1 | 1 |
| 1 | 0 | 0 | 0 | 0 |
| 1 | 0 | 0 | 0 | 1 |
| 1 | 0 | 0 | 1 | 0 |
| 1 | 0 | 0 | 1 | 1 |
| 1 | 1 | 0 | 0 | 0 |
| 1 | 1 | 0 | 0 | 1 |
| 1 | 1 | 0 | 1 | 0 |
| 1 | 1 | 0 | 1 | 1 |
| 0 | 0 | 1 | 0 | 0 |
| 0 | 0 | 1 | 0 | 1 |
| 0 | 0 | 1 | 1 | 0 |
| 0 | 0 | 1 | 1 | 1 |
| 0 | 1 | 1 | 0 | 0 |
| 0 | 1 | 1 | 0 | 1 |
| 0 | 1 | 1 | 1 | 0 |
| 0 | 1 | 1 | 1 | 1 |
| 1 | 0 | 1 | 0 | 0 |
| 1 | 0 | 1 | 0 | 1 |
| 1 | 0 | 1 | 1 | 0 |
| 1 | 0 | 1 | 1 | 1 |
| 1 | 1 | 1 | 0 | 0 |
| 1 | 1 | 1 | 0 | 1 |
| 1 | 1 | 1 | 1 | 0 |
| 1 | 1 | 1 | 1 | 1 |

SEMICONDUCTOR DEVICE AND OPERATING METHOD WITH PAGE BUFFER INCLUDING LATCHES

CROSS-REFERENCE TO RELATED APPLICATION

This application claims priority under 35 U.S.C. § 119 to Korean Patent Application No. 10-2023-0018626 filed on Feb. 13, 2023, which is incorporated herein by reference in its entirety.

BACKGROUND

1. Technical Field

Embodiments of the present disclosure relate to an integrated circuit technology, and, more particularly, to a semiconductor device and an operating method of the semiconductor device.

2. Related Art

As electronic devices are reduced in size, with low power consumption and high performance, a semiconductor device capable of storing information is required for various electronic devices, such as computers and portable communication devices. The semiconductor device may be basically divided into a volatile memory device and a nonvolatile memory device. The volatile memory device has a fast data processing speed, but has a disadvantage in that the volatile memory device needs to be continuously supplied with power in order to maintain data that has been stored in the volatile memory device. The nonvolatile memory device does not need to be continuously supplied with power in order to maintain data that has been stored in the nonvolatile memory device, but has a disadvantage in that the nonvolatile memory device has a slow data processing speed.

In order to deploy more memory cells in the same area of a nonvolatile memory device, a technology for forming a plurality of memory cells by cutting one hole is being developed.

Furthermore, research on the development of a technology for storing multi-bit data in two memory cells is being carried out.

SUMMARY

In an embodiment of the present disclosure, a semiconductor device may include a page buffer comprising first to fifth latches, wherein the first to third latches and the fifth latch are configured to store 4-bit original data, among 5-bit original data, respectively, and the fourth latch is configured to store data identical with the data that has been stored in the second latch and a control circuit configured to determine a program inhibition pattern based on data that have been stored in two of the first to fifth latches and control the page buffer so that data that has been stored in at least one of the first to fifth latches is inverted based on the program inhibition pattern.

In an embodiment of the present disclosure, an operating method of a semiconductor device may include receiving 4-bit original data, among 5-bit original data, encoding the 4-bit original data into 5-bit conversion data, programming 3-bit conversion data, among the 5-bit conversion data, into a first memory cell, receiving remaining 1-bit original data, among the 5-bit original data and programming remaining 2-bit conversion data and the remaining 1-bit original data, among the 5-bit conversion data, into a second memory cell.

In an embodiment of the present disclosure, an operating method of a semiconductor device may include receiving 4-bit original data, among 5-bit original data, converting the 4-bit original data into 5-bit conversion data including 2-bit conversion data and remaining 3-bit conversion data, determining whether the remaining 3-bit conversion data have been encoded based on the 2-bit conversion data and determining whether the 2-bit conversion data have been encoded based on 2-bit data, among the remaining 3-bit conversion data.

BRIEF DESCRIPTION OF THE DRAWINGS

FIG. 3 is a diagram for describing reading of data from a memory cell by a semiconductor device according to an embodiment of the present disclosure.

FIG. 4A, FIG. 4B and FIG. 4C are a diagram for describing an encoding operation of a semiconductor device according to an embodiment of the present disclosure.

FIG. 7A, FIG. 7B and FIG. 7C are a diagram for describing an encoding operation of a semiconductor device according to another embodiment of the present disclosure.

DETAILED DESCRIPTION

Hereinafter, embodiments according to the technical spirit of the present disclosure are described with reference to the accompanying drawings.

Embodiments of the present disclosure may provide a semiconductor device capable of reducing the number of latches that is necessary for an encoding operation and an operating method of the semiconductor device.

It is possible to improve an area margin of the semiconductor device by reducing the number of latches of a page buffer, which is necessary for an encoding operation.

Figure 1:
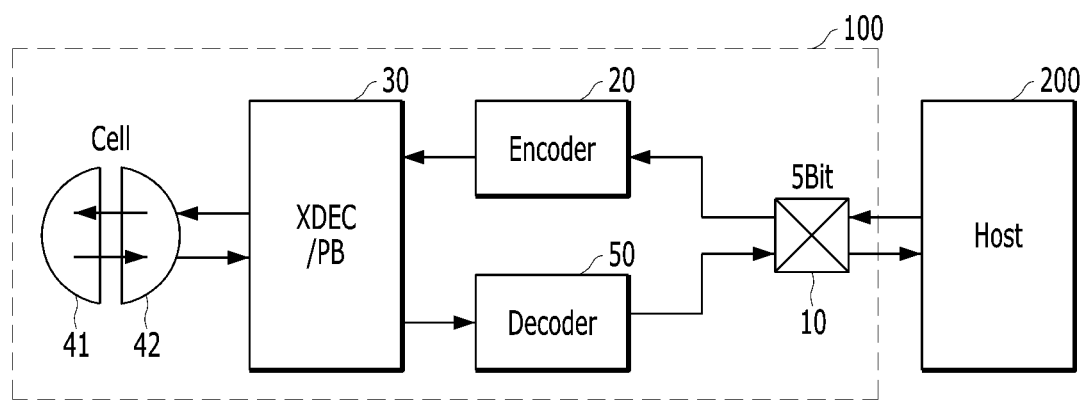
FIG. 1 is a diagram for schematically describing a semiconductor device according to an embodiment of the present disclosure.

FIG. 1 is a diagram for schematically describing a semiconductor device 100 according to an embodiment of the present disclosure.

Referring to FIG. 1, the semiconductor device 100 may be configured to store multi-bit data in a pair of memory cells 41 and 42 by distributing the multi-bit data and outputting the multi-bit data. For example, the semiconductor device 100 may receive multi-bit data having 5 bits from a host 200, and may store the multi-bit data having 5 bits in the pair of memory cells 41 and 42 by distributing the multi-bit data having 5 bits. Furthermore, the semiconductor device 100 may restore, to multi-bit data having 5 bits, data that have been distributed and stored in the pair of memory cells 41 and 42, and may transmit the restored data to the host 200.

The semiconductor device 100 may include a data input and output circuit 10, an encoder 20, a data transfer circuit 30, the pair of memory cells 41 and 42, and a decoder 50. As illustrated in FIG. 1, the semiconductor device 100 may perform an operation of storing received multi-bit data in the pair of memory cells 41 and 42 by distributing the multi-bit data, restoring data that has been stored in the pair of memory cells 41 and 42, and outputting the restored data.

The data input and output circuit 10 may receive multi-bit data (e.g., 5-bit data) from the host 200.

The encoder 20 may distribute 5-bit data so that the 5-bit data is stored in the pair of memory cells 41 and 42, and may encode the distributed data if necessary.

The data transfer circuit 30 may transfer distributed data to the pair of memory cells 41 and 42 so that the distributed data is stored in the pair of memory cells 41 and 42, respectively. Furthermore, the data transfer circuit 30 may transfer, to the decoder 50, data that has been stored in the pair of memory cells 41 and 42. In an embodiment, the data transfer circuit 30 may include a row decoder (X_DEC) and a page buffer (PB) capable of selecting the pair of memory cells 41 and 42 and sensing the pair of memory cells 41 and 42 that have been selected.

The pair of memory cells 41 and 42 may include a first memory cell 41 and a second memory cell 42. In an embodiment, each of the first and second memory cells 41 and 42 may include a multi-level cell (MLC). The pair of memory cells 41 and 42 may be memory cells that have been formed by cutting one memory cell. The first memory cell 41 may include an odd plug cell. The second memory cell 42 may include an even plug cell.

The decoder 50 may restore, to 5-bit data, the data that have been transferred by the data transfer circuit 30 (e.g., data that have been distributed and stored).

The data that has been restored by the decoder 50 may be output to the host 200 through the data input and output circuit 10.

Figure 2:
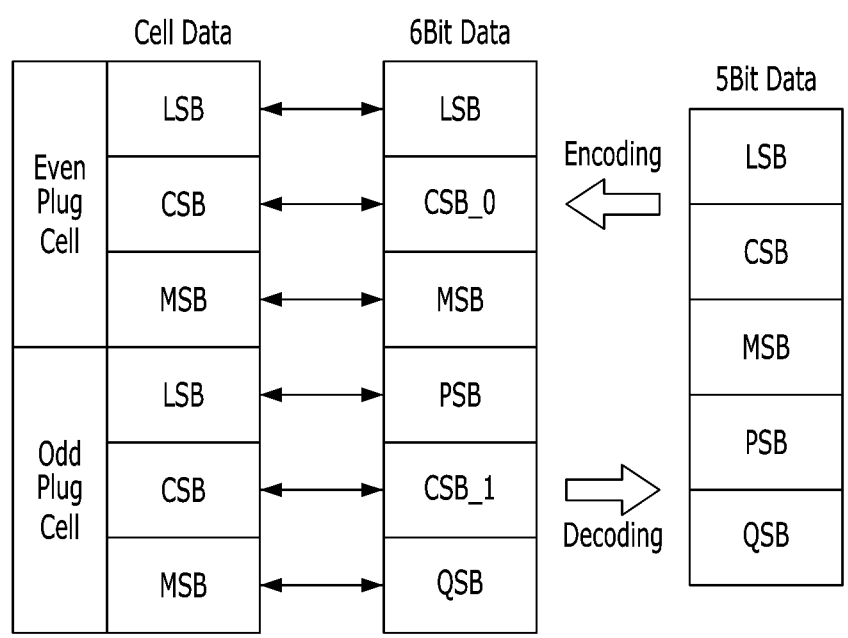
FIG. 2 is a diagram for schematically describing input and output of data by a semiconductor device according to an embodiment of the present disclosure.

FIG. 2 is a diagram for schematically describing input and output of data by a semiconductor device according to an embodiment of the present disclosure. FIG. 2 is a diagram for schematically describing an operation of distributing multi-bit data in order to store the multi-bit data in a pair of memory cells and encoding the distributed data and an operation of restoring, to multi-bit data, data that has been stored in the pair of memory cells. FIG. 2 merely describes multi-bit data having 5 bits as an example, and does not limit multi-bit data to 5-bit data.

Referring to FIG. 2, multi-bit data having 5 bits may include data having first to fifth bits QSB, PSB, MSB, CSB, and LSB (i.e., 5-bit data). Each of the first and second memory cells (e.g., odd plug cell and even plug cell) may be a multi-level cell (MLC), and may store cell data including first to third bits MSB, CSB, and LSB. In an embodiment, each of the first and second memory cells (i.e., the odd plug cell and the even plug cell) may have six different cell distributions corresponding to a combination of the cell data including the first to third bits MSB, CSB, and LSB.

In some embodiments, 5-bit data may be encoded into 6-bit data through an encoding operation. In an embodiment, the 6-bit data may include data including first to sixth bits QSB, CSB_1, PSB, MSB, CSB_0, and LSB. More specifically, the data including the first bit QSB of the 6-bit data may correspond to the data including the first bit QSB of the 5-bit data. The data including the second and fifth bits CSB_1 and CSB_0 of the 6-bit data may correspond to the data including the fourth bit CSB of the 5-bit data. The data including the third bit PSB of the 6-bit data may correspond to the data including the second bit PSB of the 5-bit data. The data including the fourth bit MSB of the 6-bit data may correspond to the data including the third bit MSB of the 5-bit data. The data including the sixth bit LSB of the 6-bit data may correspond to the data including the fifth bit LSB of the 5-bit data.

The first memory cell (i.e., the odd plug cell) may store the data including the first to third bits QSB, CSB_1, and PSB, among the 6-bit data, as the cell data including the first to third bits MSB, CSB, and LSB. In an embodiment, the first memory cell (i.e., the odd plug cell) may store the data including the first bit QSB, among the 6-bit data, as the cell data including the first bit MSB. The first memory cell (i.e., the odd plug cell) may store the data including the second bit CSB_1, among the 6-bit data, as the cell data including the second bit CSB. The first memory cell (i.e., the odd plug cell) may store the data including the third bit PSB, among the 6-bit data, as the cell data including the third bit LSB.

The second memory cell (i.e., the even plug cell) may store the data including the fourth to sixth bits MSB, CSB_0, and LSB, among the 6-bit data, as the cell data including the first to third bits MSB, CSB, and LSB. In an embodiment, the second memory cell (i.e., the even plug cell) may store the data including the fourth bit MSB, among the 6-bit data, as the cell data including the first bit MSB. The second memory cell (i.e., the even plug cell) may store the data including the fifth bit CSB_0, among the 6-bit data, as the cell data including the second bit CSB. The second memory cell (i.e., the even plug cell) may store the data including the sixth bit LSB, among the 6-bit data, as the cell data including the third bit LSB.

The data including the first to third bits MSB, CSB, and LSB of the first and second memory cells (i.e., the odd plug cell and the even plug cell) may be restored to the data including the first to fifth bits QSB, PSB, MSB, CSM, and LSB through a decoding operation.

For example, the cell data including the first to third bits MSB, CSB, and LSB that have been stored in the first memory cell (i.e., the odd plug cell) may correspond to the first to third bits QSB, CSB_1, and PSB of the 6-bit data, respectively. Furthermore, the cell data including the first to third bits MSB, CSB, and LSB that have been stored in the second memory cell (i.e., the even plug cell) may correspond to the fourth to sixth bits MSB, CSB_0, and LSB of the 6-bit data, respectively. The 6-bit data may be decoded into the 5-bit data through a decoding operation.

FIG. 3 is a diagram for describing reading of data from a memory cell by a semiconductor device according to an embodiment of the present disclosure.

As in the description of FIG. 2, the semiconductor device according to an embodiment of the present disclosure may encode 5-bit data into 6-bit data, may store data including 3 bits (e.g., QSB, CSB_1, and PSB), among the data including the 6 bits (i.e., QSB, CSB_1, PSB, MSB, CSB_0, and LSB), in the first memory cell (i.e., the odd plug cell), and may store the data including the remaining 3 bits (e.g., MSB, CSB_0, and LSB) in the second memory cell (i.e., the even plug cell). In an embodiment, at least one of the cell data including the first to third bits MSB, CSB, and LSB that are stored in each of the first and second memory cells (i.e., the odd plug cell and the even plug cell) may be encoded data.

Furthermore, at least one of the cell data including the first to third bits MSB, CSB, and LSB that are stored in each of the first and second memory cells (i.e., the odd plug cell and the even plug cell) may include information in relation to whether encoded data is included in the cell data including the first to third bits MSB, CSB, and LSB that have been stored in each memory cell (i.e., the odd plug cell or the even plug cell).

Referring to FIG. 3, a combination of the data including the second and fifth bits CSB_1 and CSB_0, among the 6-bit data, which have been stored in the second bits CSB of the first and second memory cells (i.e., the odd plug cell and the even plug cell), respectively, may include the data including the fourth bit CSB, among the 5-bit data. Furthermore, a combination of the data including the second and fifth bits CSB_1 and CSB_0, among the 6-bit data, which have been stored as the second bits CSB in the first and second memory cells (i.e., the odd plug cell and the even plug cell), respectively, may include, as coding data, information (Coding O or Coding X) in relation to whether the cell data including the first to third bits MSB, CSB, and LSB that have been stored in each of the first and second memory cells (i.e., the odd plug cell and the even plug cell) have been encoded.

For example, if the second and fifth bits CSB_1 and CSB_0 of the 6-bit data, which have been stored as the second bits CSB in the first and second memory cells (i.e., the odd plug cell and the even plug cell), respectively, have different data distributions, that is, different data values, the level of coding data may be a low (0) level. When the level of the coding data is a low level, this may mean that at least one of the first to third bits MSB, CSB, and LSB of the cell data, which have been stored in each of the first and second memory cells (i.e., the odd plug cell and the even plug cell), includes encoded data.

If the second and fifth bits CSB_1 and CSB_0 of the 6-bit data, which have been stored as the second bits CSB in the first and second memory cells (i.e., the odd plug cell and the even plug cell), respectively, have the same data distribution, that is, the same data value, the level of coding data may be a high (1) level. When the level of the coding data is a high level, this may mean that the first to third bits MSB, CSB, and LSB of the cell data, which have been stored in each of the first and second memory cells (i.e., the odd plug cell and the even plug cell), do not include encoded data.

If the level of the data including the second bit CSB_1 of the 6-bit data, which has been stored as the second bit CSB in the first memory cell (i.e., the odd plug cell), is a low level and the level of the data including the fifth bit CSB_0 of the 6-bit data, which has been stored as the second bit CSB in the second memory cell (i.e., the even plug cell), is a high level, or if the level of the data including the second bit CSB_1 of the 6-bit data, which has been stored as the second bit CSB in the first memory cell (i.e., the odd plug cell), is a low level and the level of the data including the fifth bit CSB_0 of the 6-bit data, which has been stored as the second bit CSB in the second memory cell (i.e., the even plug cell), is a low level, the data including the fourth bit CSB of the 5-bit data may be data having a low level.

If the level of the data including the second bit CSB_1 of the 6-bit data, which has been stored as the second bit CSB in the first memory cell (i.e., the odd plug cell), is a high level and the level of the data including the fifth bit CSB_0 of the 6-bit data, which has been stored as the second bit CSB in the second memory cell (i.e., the even plug cell), is a low level, or if the level of the data including the second bit CSB_1 of the 6-bit data, which has been stored as the second bit CSB in the first memory cell (i.e., the odd plug cell), is a high level and the level of the data including the fifth bit CSB_0 of the 6-bit data, which has been stored as the second bit CSB in the second memory cell (i.e., the even plug cell), is a high level, the data including the fourth bit CSB of the 5-bit data may be data having a high level.

As described above, the semiconductor device according to an embodiment of the present disclosure may perform an encoding operation and a decoding operation on data including specific bits CSB, among original data (i.e., the 5-bit data), and coding data, based on a combination of the data including the bits CSB_1 and CSB_0 that have been stored as the specific bits CSB in the first and second memory cells (i.e., the odd plug cell and the even plug cell), respectively.

FIG. 4A, FIG. 4B and FIG. 4C are a diagram for describing an encoding operation of a semiconductor device according to an embodiment of the present disclosure.

FIG. 4A, FIG. 4B and FIG. 4C illustrate an encoding operation of the semiconductor device according to an embodiment of the present disclosure, for storing the data including the 5 bits QSB, PSB, MSB, CSB, and LSB (i.e., the 5-bit data) in the first and second memory cells (i.e., the odd plug cell and the even plug cell) by distributing the data.

Referring to FIG. 4A, the data including the 5 bits QSB, PSB, MSB, CSB, and LSB may include 32 different data patterns.

Referring to FIG. 4B, the data including the 6 bits QSB, CSB_1, PSB, MSB, CSB_0, and LSB may overlappingly include data including a specific bit CSB, among the data including the 5 bits QSB, PSB, MSB, CSB, and LSB. In an embodiment, the data including the second and fifth bits CSB_1 and CSB_0, among the data including the 6 bits (i.e., QSB, CSB_1, PSB, MSB, CSB_0, and LSB) (i.e., the 6-bit data), may have the same data values as the data including the fourth bit CSB, among the data including the 5 bits QSB, PSB, MSB, CSB, and LSB. Therefore, the first bit QSB of the 6-bit data may correspond to the first bit QSB of the 5-bit data. The second and fifth bits CSB_1 and CSB_0 of the 6-bit data may correspond to the fourth bit CSB of the 5-bit data. The third bit PSB of the 6-bit data may correspond to the second bit PSB of the 5-bit data. The fourth bit MSB of the 6-bit data may correspond to the third bit MSB of the 5-bit data. The sixth bit LSB of the 6-bit data may correspond to the fifth bit LSB of the 5-bit data.

The first memory cell (i.e., the odd plug cell) may store the data including the 3 bits (i.e., QSB, CSB_1, and PSB), among the data including the 6 bits (i.e., QSB, CSB_1, PSB, MSB, CSB_0, and LSB). The second memory cell (i.e., the even plug cell) may store the data including the 3 bits (i.e., MSB, CSB_0, and LSB), among the data including the 6 bits (i.e., QSB, CSB_1, PSB, MSB, CSB_0, and LSB). In an embodiment, each of the first and second memory cells (i.e., the odd plug cell and the even plug cell) might not have a cell distribution of a data pattern (0, 0, 1) or (0, 0, 0). The data pattern for the cell distribution, which is not stored by each of the first and second memory cells (i.e., the odd plug cell and the even plug cell), may be named a program inhibition data pattern (0, 0, 1) or (0, 0, 0).

In some embodiments, the program inhibition data pattern (0, 0, 1) or (0, 0, 0) according to a cell distribution, which is not stored by the first memory cell (i.e., the odd plug cell), may be encoded into a data pattern of a cell distribution, which may be stored by the first memory cell (i.e., the odd plug cell), and may be stored in the first memory cell (i.e., the odd plug cell). Furthermore, the program inhibition data pattern (0, 0, 1) or (0, 0, 0) according to a cell distribution, which is not stored by the second memory cell (i.e., the even plug cell), may be encoded into a data pattern of a cell distribution, which may be stored by the second memory cell (i.e., the even plug cell), and may be stored in the second memory cell (i.e., the even plug cell).

Referring to FIG. 4C, the program inhibition data patterns (0, 0, 1) and (0, 0, 0) that is not stored in the first memory cell (i.e., the odd plug cell) may be encoded into (1, 0, 1) and (1, 0, 0), respectively. The program inhibition patterns (0, 0, 1) and (0, 0, 0) that are not stored in the second memory cell (i.e., the even plug cell) may be encoded into (1, 0, 1) or (1, 1, 1) and (1, 0, 0) or (1, 1, 0), respectively. In an embodiment, if encoded data is to be stored in the first memory cell (i.e., the odd plug cell), the bits MSB and CSB_0, among the 3 bits MSB, CSB_0, and LSB to be stored in the second memory cell (i.e., the even plug cell), may be inverted. If encoded data is to be stored in the second memory cell (i.e., the even plug cell), the bits QSB and CSB_1, among the 3 bits QSB, CSB_1, and PSB to be stored in the first memory cell (i.e., the odd plug cell), may be inverted.

Figure 5:
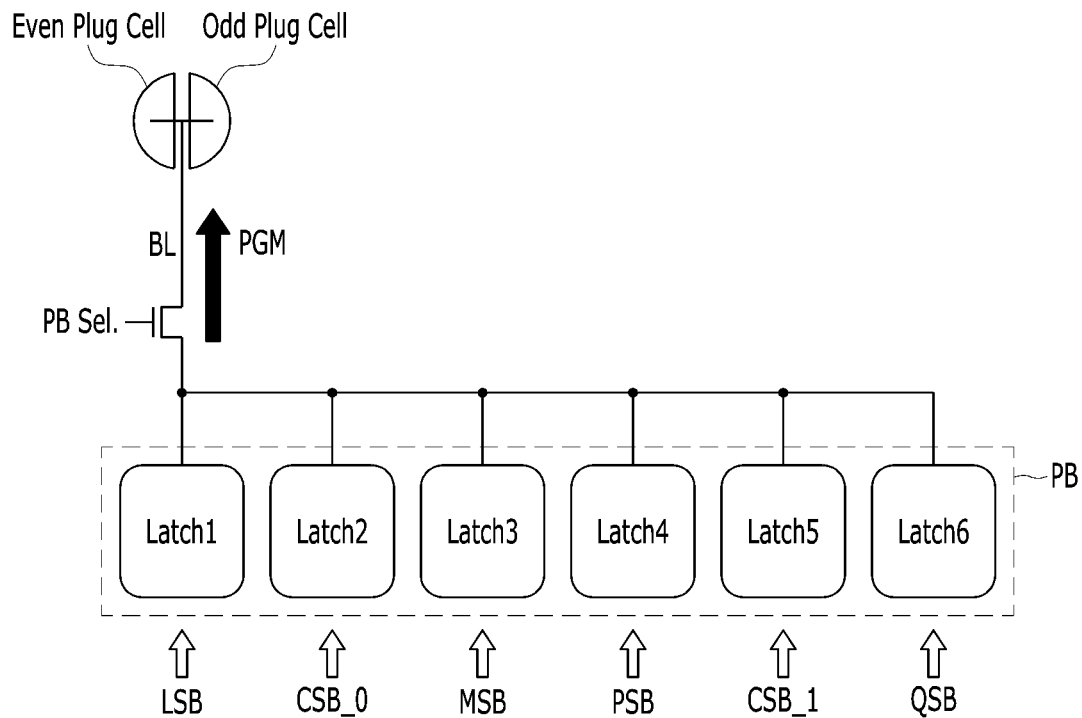
FIG. 5 is a diagram for describing an operation of a page buffer with respect to an encoding operation of a semiconductor device according to an embodiment of the present disclosure.

As a result, the semiconductor device according to an embodiment of the present disclosure can encode, into 32 different patterns, the data including the 3 bits QSB, CSB_1, and PSB to be stored in the first memory cell (i.e., the odd plug cell) and the data including the 3 bits MSB, CSB_0, and LSB to be stored in the second memory cell (i.e., the even plug cell) without including the program inhibition data pattern (0, 0, 1) or (0, 0, 0) in each of the 3 bits QSB, CSB_1, and PSB and the 3 bits MSB, CSB_0, and LSB, as shown in FIG. 4C FIG. 5 is a diagram for describing an operation of a page buffer with respect to an encoding operation of the semiconductor device according to an embodiment of the present disclosure.

Referring to FIG. 5, a page buffer PB may include first to sixth latches Latch1, Latch2, Latch3, Latch4, Latch5, and Latch6. The first to sixth latches Latch1, Latch2, Latch3, Latch4, Latch5, and Latch6 may store the data including the 6 bits QSB, CSB_1, PSB, MSB, CSB_0, and LSB, respectively. In an embodiment, the bits LSB, CSB_0, and MSB that are stored in the first to third latches Latch1, Latch2, and Latch3, respectively, may be programmed into the second memory cell (i.e., the even plug cell). The bits PSB, CSB_1, and QSB that are stored in the fourth to sixth latches Latch4, Latch5, and Latch6, respectively, may be programmed into the first memory cell (i.e., the odd plug cell).

In some embodiments, when the 5-bit data is received as shown in FIG. 4A, the page buffer PB may store the 6-bit data by overlapping the 5-bit data and a specific bit CSB, among the 5-bit data, as shown in FIG. 4B. In an embodiment, the first latch Latch1 may store the bit LSB, among the 5-bit data. The second latch Latch2 may store the bit CSB, among the 5-bit data, as a bit CSB_0. The third latch Latch3 may store the bit MSB, among the 5-bit data. The fourth latch Latch4 may store the bit PSB, among the 5-bit data. The fifth latch Latch5 may store the bit CSB, among the 5-bit data, as a bit CSB_1. The sixth latch Latch6 may store the bit QSB, among the 5-bit data.

The data including each of the bits QSB, CSB_1, PSB, MSB, CSB_0, and LSB that have been stored in the page buffer PB may be encoded as in FIG. 4C. The value of each of the bits that have been stored in the first to sixth latches Latch1 to Latch6 of the page buffer PB may be inverted or maintained by a control circuit (110 in FIG. 11). Therefore, the data including the bits QSB, CSB_1, PSB, MSB, CSB_0, and LSB that have been stored in the page buffer PB may be encoded as shown in FIG. 4C by the control circuit.

As shown in FIG. 4C, the page buffer PB that has stored the encoded data including the 6 bits may program data including 3 bits, among the 6 bits, in each of the first and second memory cells (i.e., the odd plug cell and the even plug cell). For example, the data including the 3 bits that have been stored in the first to third latches Latch1 to Latch3 may be programmed into the second memory cell (i.e., the even plug cell). The data including the 3 bits that have been stored in the fourth to sixth latches Latch4 to Latch6 may be programmed into the first memory cell (i.e., the odd plug cell).

Figure 6:
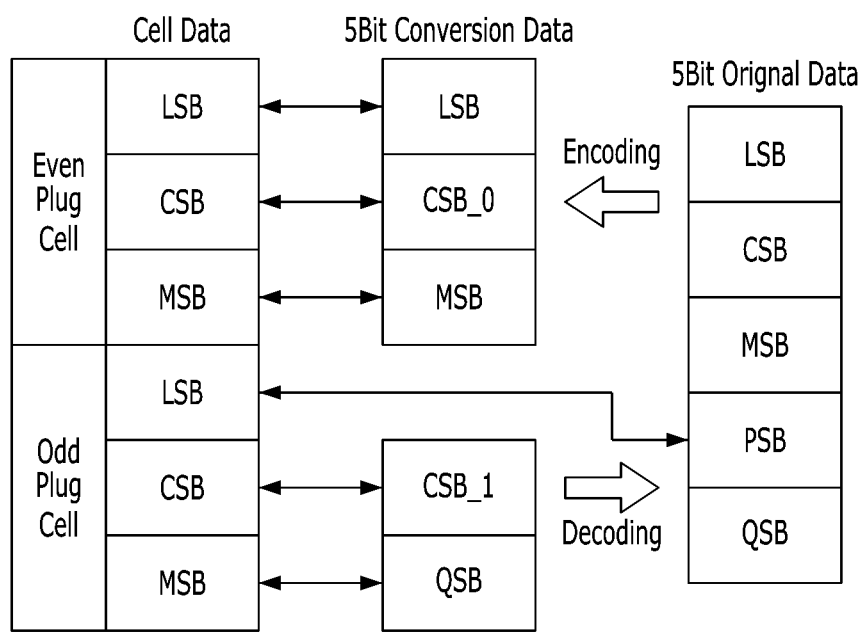
FIG. 6 is a diagram for schematically describing input and output of data by a semiconductor device according to another embodiment of the present disclosure.

FIG. 6 is a diagram for schematically describing input and output of data by a semiconductor device according to another embodiment of the present disclosure.

Referring to FIG. 6, 5-bit original data may include data including first to fifth bits QSB, PSB, MSB, CSB, and LSB. In an embodiment, each of the first and second memory cells (i.e., the odd plug cell and the even plug cell) may have six different cell distributions corresponding to a combination of the data including 3 bits MSB, CSB, and LSB.

In some embodiments, the 5-bit original data may be encoded into 5-bit conversion data through an encoding operation. In an embodiment, the 5-bit conversion data may include the data including first to fifth bits QSB, CSB_1, MSB, CSB_0, and LSB. More specifically, the first bit QSB of the 5-bit conversion data may correspond to the first bit QSB of the 5-bit original data. The second and fourth bits CSB_1 and CSB_0 of the 5-bit conversion data may correspond to the fourth bit CSB of the 5-bit original data. The third bit MSB of the 5-bit conversion data may correspond to the third bit MSB of the 5-bit original data. The fifth bit LSB of the 5-bit conversion data may correspond to the fifth bit LSB of the 5-bit original data.

The second memory cell (i.e., the even plug cell) may store the fourth to sixth bits MSB, CSB_0, and LSB, among the 5-bit conversion data, as the first to third bits MSB, CSB, and LSB of cell data, respectively.

The first memory cell (i.e., the odd plug cell) may store the first and second bits QSB and CSB_1, among the 5-bit conversion data, and the second bit PSB, among the 5-bit original data, as the first to third bits MSB, CSB, and LSB of the cell data, respectively.

The cell data including the first to third bits MSB, CSB, and LSB of each of the first and second memory cells (i.e., the odd plug cell and the even plug cell) may be restored to the 5-bit original data including the first to fifth bits QSB, PSB, MSB, CSB, and LSB through a decoding operation.

In some embodiments, the first and third bits MSB and LSB of the cell data that have been stored in the first memory cell (i.e., the odd plug cell) may correspond to the first and second bits QSB and PSB of the 5-bit original data, respectively. The first and third bits MSB and LSB of the cell data that have been stored in the second memory cell (i.e., the even plug cell) may correspond to the third and fifth bits MSB and LSB of the 5-bit original data, respectively. A combination of the cell data including the second bit CSB that has been stored in the first memory cell (i.e., the odd plug cell) and the cell data including the second bit CSB that has been stored in the second memory cell (i.e., the even plug cell) may correspond to the fourth bit CSB of the 5-bit original data. More specifically, based on a combination of the data including the second bits CSB that have been stored in the first and second memory cells (i.e., the odd plug cell and the even plug cell), a value of the data including the fourth bit CSB of the 5-bit original data may be determined, and the data including the first and fifth bits QSB and LSB of the 5-bit original data may be inverted or maintained.

Figure 7B:
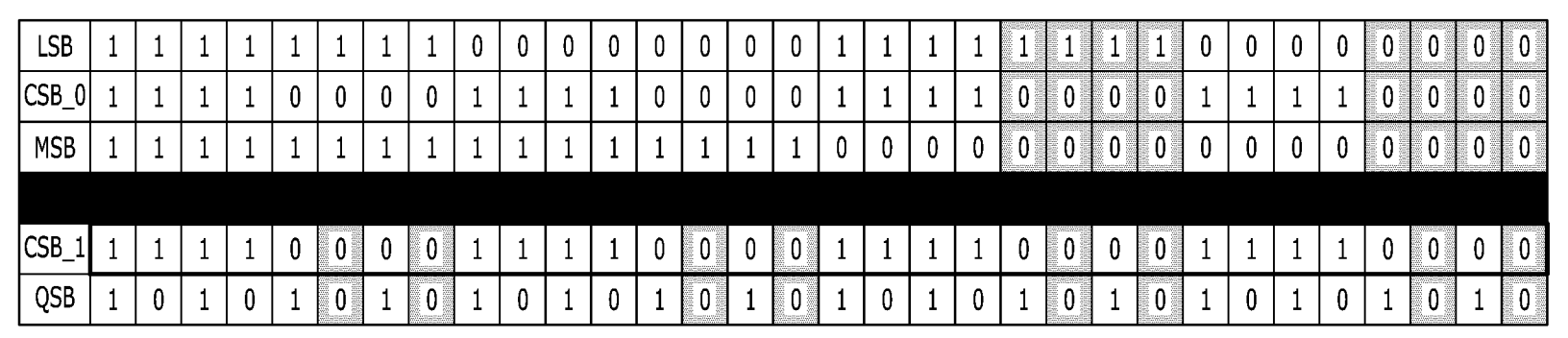
Figure 7C:
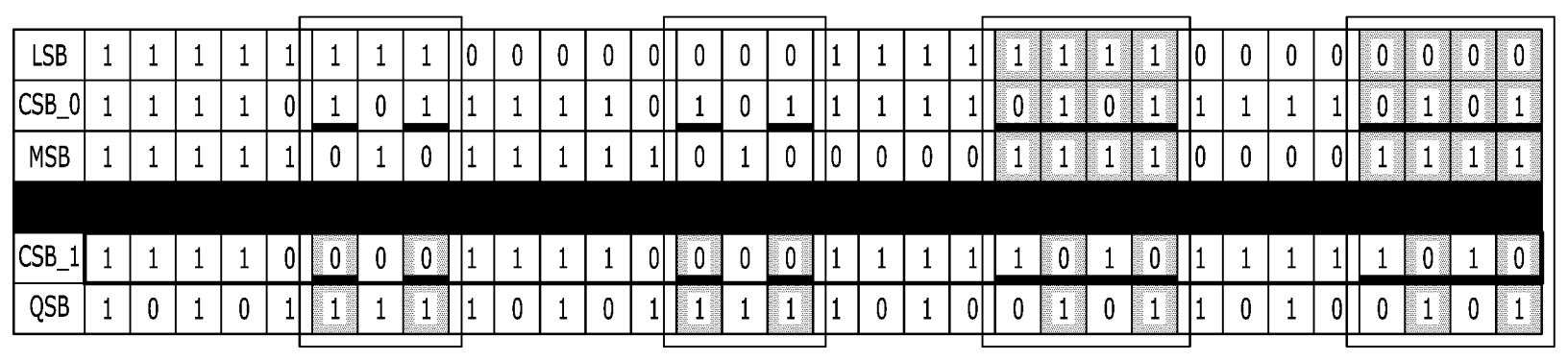

FIG. 7A, FIG. 7B and FIG. 7C are a diagram for describing an encoding operation of a semiconductor device according to another embodiment of the present disclosure.

FIG. 7A, FIG. 7B and FIG. 7C illustrate an encoding operation of the semiconductor device according to another embodiment of the present disclosure, for converting 5-bit original data into 5-bit conversion data. In some embodiments, the 5-bit original data may include first to fifth bits QSB, PSB, MSB, CSB, and LSB. The 5-bit conversion data may include first to fifth bits QSB, CSB_1, MSB, CSB_0, and LSB.

The first memory cell (i.e., the odd plug cell) may store the data including the first and second bits QSB and CSB_1, among the 5-bit conversion data QSB, CSB_1, MSB, CSB_0, and LSB on which encoding has been completed, and the second bit PSB of the 5-bit original data. The second memory cell (i.e., the even plug cell) may store the data including the third to fifth bits (i.e., MSB, CSB_0, and LSB), among the 5-bit conversion data QSB, CSB_1, MSB, CSB_0, and LSB on which encoding has been completed. In an embodiment, each of the bits MSB, CSB, and LSB of each of the first and second memory cells (i.e., the odd plug cell and the even plug cell) might not have a cell distribution of the data patterns (0, 0, 1) and (0, 0, 0). In an embodiment, the data pattern for the cell distribution that is now stored by each of the first and second memory cells (i.e., the odd plug cell and the even plug cell) may be named a program inhibition data pattern (0, 0, 1) or (0, 0, 0).

Referring to FIG. 7A, the 5-bit original data QSB, PSB, MSB, CSB, and LSB may include 32 different data patterns.

Referring to FIG. 7B, the first bit QSB of the 5-bit conversion data may correspond to the first bit QSB of the 5-bit original data. The second bit CSB_1 of the 5-bit conversion data may correspond to the fourth bit CSB of the 5-bit original data. The third bit MSB of the 5-bit conversion data may correspond to the third bit MSB of the 5-bit original data. The fourth bit CSB_0 of the 5-bit conversion data may correspond to the fourth bit CSB of the 5-bit original data. The fifth bit LSB of the 5-bit conversion data may correspond to the fifth bit LSB of the 5-bit original data. As a result, the first bits QSB, third bits MSB, and fifth bits LSB of the 5-bit conversion data and those of the 5-bit original data illustrated in FIG. 7B may have the same data. The second and fourth bits CSB_1 and CSB_0 of the 5-bit conversion data may have the same data as the fourth bit CSB of the 5-bit original data.

Each of the first and second memory cells (i.e., the odd plug cell and the even plug cell) might not have a cell distribution of the data patterns (0, 0, 1) and (0, 0, 0). In an embodiment, each of the data patterns (0, 0, 1) and (0, 0, 0) may correspond to the bits MSB, CSB, and LSB of cell data. That is, in each of the first and second memory cells (i.e., the odd plug cell and the even plug cell), a data pattern when both the levels of the bits MSB and CSB, among the bits MSB, CSB, and LSB of the cell data to be programmed, have a low (0) level may be a program inhibition data pattern.

Accordingly, a data pattern when both the levels of the first and second bits QSB and CSB_1 of the 5-bit conversion data have a low (0) level or when both the levels of the third and fourth bits MSB and CSB_0 of the 5-bit conversion data have a low (0) level may be a program inhibition data pattern for the first and second memory cells (i.e., the odd plug cell and the even plug cell).

Referring to FIG. 7C, when the levels of the first and second bits QSB and CSB_1 to be stored in the first memory cell (i.e., the odd plug cell) as the cell data, among the 5-bit conversion data, are (0, 0), the data including the first bit QSB and the third bit MSB, among the 5-bit conversion data, may be encoded (e.g., the data may be inverted), and the fourth bit CSB_0 of the 5-bit conversion data may be inverted. When the levels of the third and fourth bits MSB and CSB_0 of the 5-bit conversion data to be stored in the second memory cell (i.e., the even plug cell) as the cell data are (0, 0), the data including the third bit MSB and the first bit QSB, among the 5-bit conversion data, may be encoded (e.g., the data may be inverted), and the second bit CSB_1 of the 5-bit conversion data may be inverted.

Results of an encoding operation of the semiconductor device according to another embodiment of the present disclosure, which have been illustrated in FIG. 7C, may be the same as results except the third bit PSB, among the 6-bit conversion data QSB, CSB_1, PSB, MSB, CSB_0, and LSB in FIG. 4C.

In an encoding operation of the semiconductor device according to another embodiment of the present disclosure, 5-bit conversion data may be generated by performing the encoding operation on the 4 bits QSB, MSB, CSB, and LSB except a specific bit PSB, among the 5-bit original data QSB, PSB, MSB, CSB, and LSB. The 3 bits MSB, CSB_0, and LSB, among the 5-bit conversion data QSB, CSB_1, MSB, CSB_0, and LSB on which the encoding operation has been completed, may be programmed into one of the pair of memory cells. Thereafter, the remaining 2 bits QSB and CSB_1, among the 5-bit conversion data QSB, CSB_1, MSB, CSB_0, and LSB, and the specific bit PSB of the 5-bit original data may be programmed into the other of the pair of memory cells.

Figure 8:
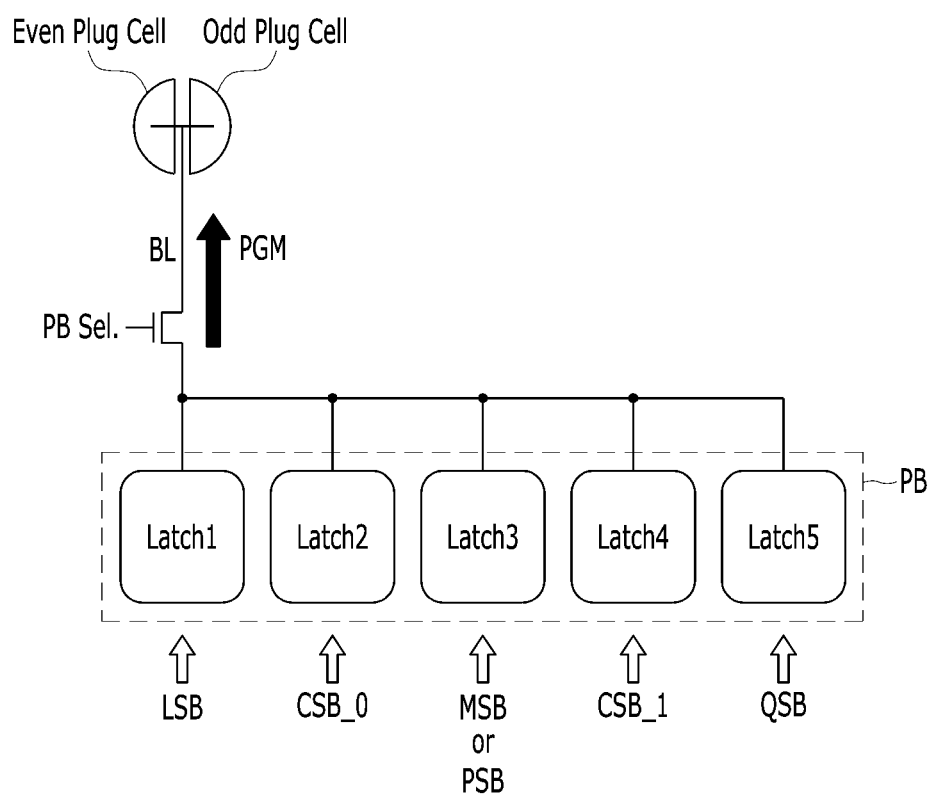
FIG. 8 is a diagram for describing an operation of a page buffer with respect to an encoding operation of a semiconductor device according to another embodiment of the present disclosure.

FIG. 8 is a diagram for describing an operation of a page buffer with respect to an encoding operation of a semiconductor device according to another embodiment of the present disclosure.

Referring to FIG. 8, a page buffer PB may include first to fifth latches Latch1, Latch2, Latch3, Latch4, and Latch5. The first to fifth latches Latch1, Latch2, Latch3, Latch4, and Latch5 may store the bits of 5-bit conversion data QSB, CSB_1, MSB, CSB_0, and LSB, respectively. In an embodiment, LSB, CSB_0, and MSB that are stored in the first to third latches Latch1, Latch2, and Latch3 may be stored as the cell data, and may be programmed into the second memory cell (i.e., the even plug cell). Thereafter, the bit PSB, among the 5-bit original data, may be stored in the third latch Latch3. The bit PSB that has been stored in the third latch Latch3 and the bits CSB_1 and QSB that have been stored in the fourth and fifth latches Latch4 and Latch5 may be programmed into the first memory cell (i.e., the odd plug cell) as the cell data.

In an embodiment, when the 5-bit original data is received as shown in FIG. 7A, the page buffer PB may store the data including the remaining 4 bits LSB, CSB, MSB, and QSB except the bit PSB, among the 5-bit original data, as shown in FIG. 7B. In an embodiment, the first latch Latch1 may store the data including the bit LSB, among the 5-bit original data. The second latch Latch2 may store the data including the bit CSB, among the 5-bit original data, as the data including the bit CSB_0. The third latch Latch3 may store the data including the bit MSB, among the 5-bit original data. The fourth latch Latch4 may store the data including the bit CSB, among the 5-bit original data, as the data including the bit CSB_1. The fifth latch Latch5 may store the data including the bit QSB, among the 5-bit original data.

The data including each of the bits QSB, CSB_1, MSB, CSB_0, and LSB that have been stored in the page buffer PB may be encoded as shown in FIG. 7C. The values of the data that have been stored in the first to fifth latches Latch1 to Latch5 of the page buffer PB may be controlled to be inverted and maintained. Therefore, the data including each of the bits QSB, CSB_1, MSB, CSB_0, and LSB that have been stored in the page buffer PB may be encoded through the control circuit as shown in FIG. 7C. In an embodiment, the control circuit may encode the data including the bits CSB_0 and MSB that have been stored in the second and third latches Latch2 and Latch3, based on the bits CSB_1 and QSB that have been stored in the fourth and fifth latches Latch4 and Latch_5 of the page buffer PB. In an embodiment, the control circuit may encode the data including the bits CSB_1 and QSB that have been stored in the fourth and fifth latches Latch4 and Latch5, based on the bits CSB_0 and MSB that have been stored in the second and third latches Latch2 and Latch3 of the page buffer PB. After the encoding operation is completed, the bits LSB, CSB_0, and MSB that have been stored in the first to third latches Latch1, Latch2, and Latch3 may be programmed into the second memory cell (i.e., the even plug cell) as the cell data. After the second memory cell (i.e., the even plug cell) is programmed, the third latch Latch3 may store the bit PSB of the 5-bit original data. The bits PSB, CSB_1, and QSB that have been stored in the third to fifth latches Latch3, Latch4, and Latch5 may be programmed into the first memory cell (i.e., the odd plug cell) as the cell data.

When FIGS. 5 and 8 are compared, the semiconductor device according to another embodiment of the present disclosure can perform the same encoding operation while reducing the number of latches that are included in the page buffer.

Figure 9:
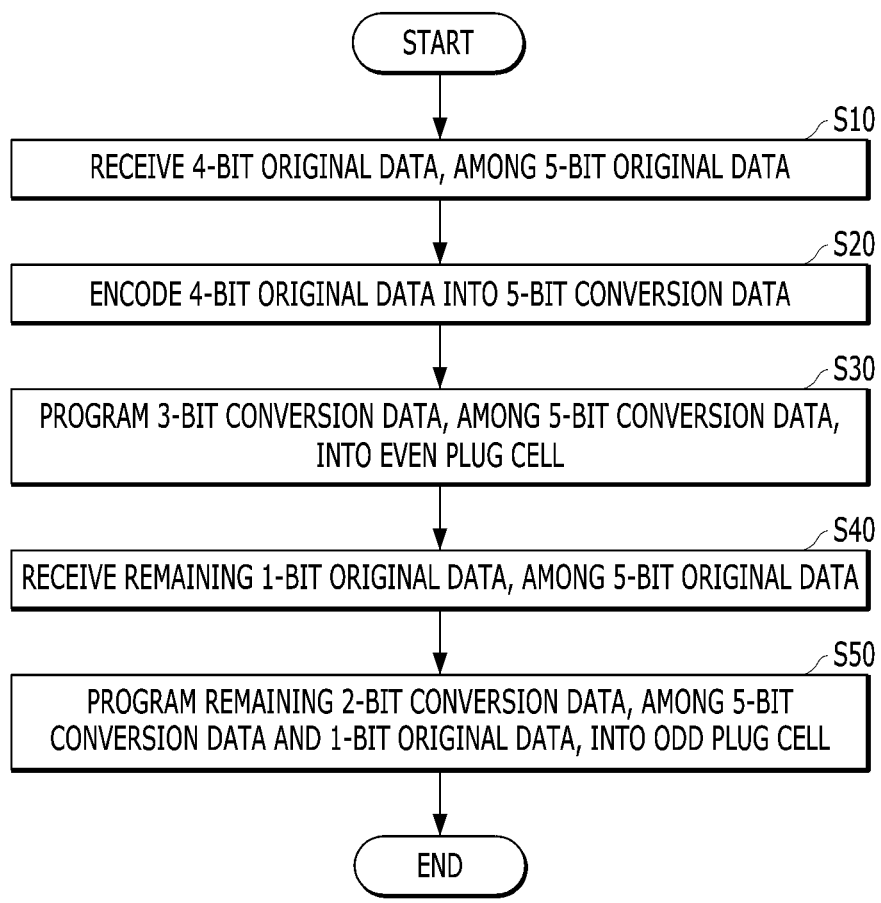
FIGS. 9 and 10 are flowcharts for describing an operating method of a semiconductor device according to another embodiment of the present disclosure.
Figure 10:
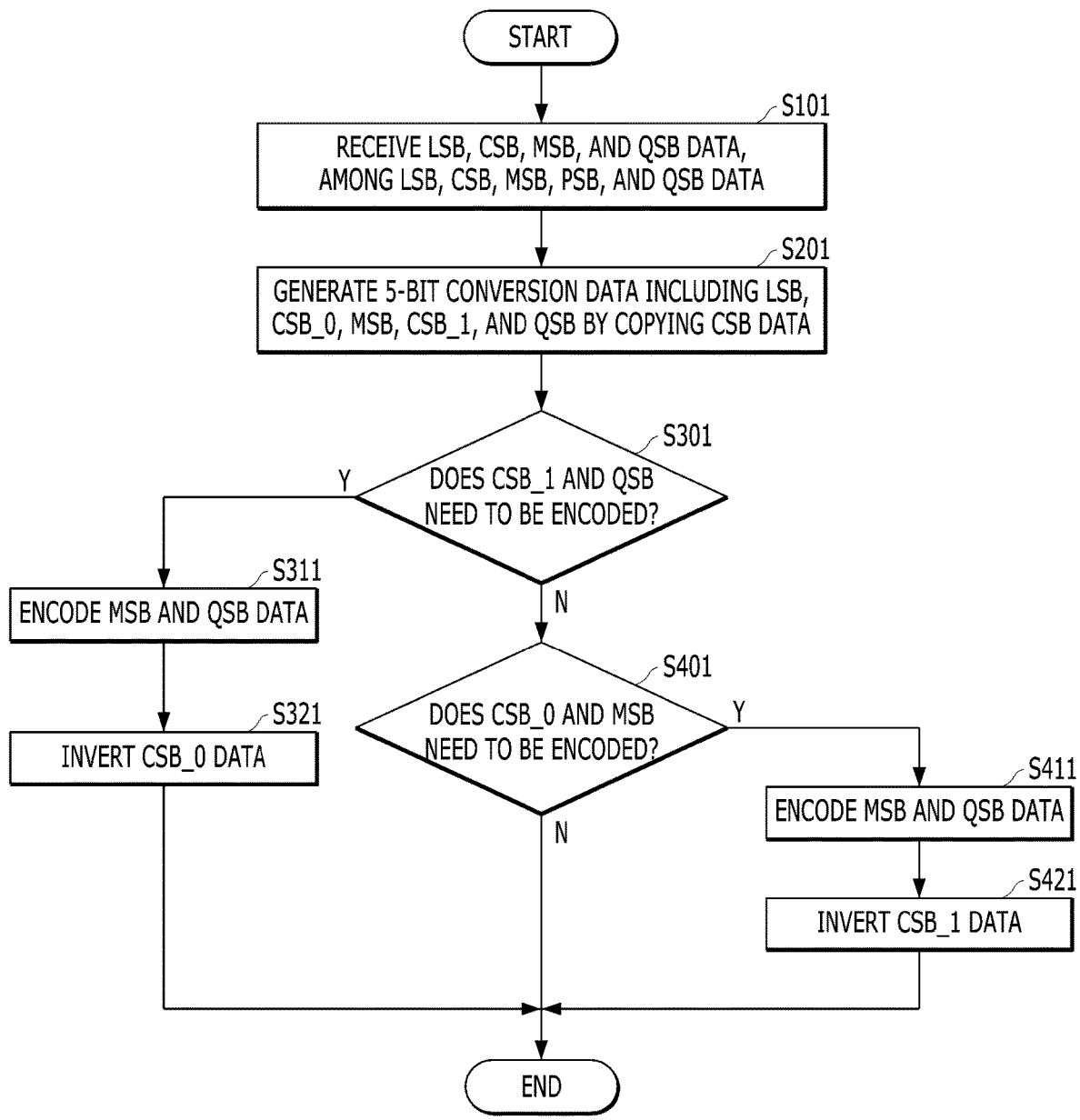

FIGS. 9 and 10 are flowcharts for describing an operating method of the semiconductor device according to another embodiment of the present disclosure.

FIG. 9 illustrates a program method of the semiconductor device according to another embodiment of the present disclosure.

As shown in FIG. 9, the program method of the semiconductor device according to another embodiment of the present disclosure may include a first data reception operation S10, an encoding operation S20, a first program operation S30, a second data reception operation S40, and a second program operation S50.

The first data reception operation S10 may include an operation of receiving 4-bit original data, among 5-bit original data. In an embodiment, the 5-bit original data may include bits QSB, PSB, MSB, CSB, and LSB. The 4-bit original data may include bits QSB, MSB, CSB, and LSB except the bit PSB.

The encoding operation S20 may include an operation of encoding the 4-bit original data into 5-bit conversion data. The 5-bit conversion data may include bits QSB, CSB_1, MSB, CSB_0, and LSB. The bits QSB, MSB, and LSB of the 5-bit conversion data may correspond to the bits QSB, MSB, and LSB of the 4-bit original data, respectively. The bits CSB_1 and CSB_0 of the 5-bit conversion data may correspond to the bit CSB of the 4-bit original data. If the bits QSB and CSB_1, among the 5-bit conversion data, correspond to a program inhibition data pattern, an encoding operation of inverting the bits QSB, MSB, and CSB_0, among the 5-bit conversion data, may be performed. If the bits MSB and CSB_0, among the 5-bit conversion data, correspond to a program inhibition data pattern, an encoding operation of inverting the bits QSB, MSB, and CSB_1, among the 5-bit conversion data, may be performed. A method of encoding the 5-bit conversion data will be described in detail with reference to FIG. 10.

The first program operation S30 may include an operation of programming the data including the 3 bits MSB, CSB_0, and LSB on which the encoding has been completed, among the 5-bit conversion data, into the second memory cell (i.e., the even plug cell) as cell data.

The second data reception operation S40 may include an operation of receiving the remaining 1-bit original data, among the 5-bit original data. In an embodiment, the remaining 1-bit original data may include the bit PSB that has not been received in the first data reception operation S10, among the 5-bit original data.

The second program operation S50 may include an operation of programming, into the first memory cell (i.e., the odd plug cell), the conversion data including the 2 bits that have not been used in the first program operation S30, among the 5-bit conversion data, and the remaining 1-bit original data that has been received in the second data reception operation S40, as the cell data. In an embodiment, the conversion data including the 2 bits may include the bits QSB and CSB_1, and the remaining 1-bit original data may include the bit PSB.

FIG. 10 illustrates an encoding method of the semiconductor device according to another embodiment of the present disclosure.

Referring to FIG. 10, the encoding method of the semiconductor device according to another embodiment of the present disclosure may include a data reception operation S101, a 5-bit conversion data generation operation S201, a first encoding-required determination operation S301, a first encoding operation S311, a first inversion operation S321, a second encoding-required determination operation S401, a second encoding operation S411, and a second inversion operation S421.

The data reception operation S101 may include an operation of receiving 4-bit original data including bits LSB, CSB, MSB, and QSB among 5-bit original data including bits LSB, CSB, MSB, PSB, and QSB.

The 5-bit conversion data generation operation S201 may include an operation of generating 5-bit conversion data including bits LSB, CSB_0, MSB, CSB_1, and QSB. In an embodiment, bits CSB_0 and CSB_1 of 5-bit conversion data may be generated by copying the bit CSB, among the 4-bit original data. In an embodiment, the 5-bit conversion data may include bits LSB, CSB_0, MSB, CSB_1, and QSB. The bits LSB, MSB, and QSB of the 5-bit conversion data may correspond to the LSB, MSB, and QSB of the 4-bit original data, respectively. The bits CSB_0 and CSB_1 of the 5-bit conversion data may correspond to the bit CSB of the 4-bit original data.

The first encoding-required determination operation S301 may include an operation of determining whether the data including the bits CSB_1 and QSB of the 5-bit conversion data need to be encoded. For example, the first encoding-required determination operation S301 may include an operation of determining whether the bits CSB_1 and QSB of the 5-bit conversion data correspond to a program inhibition data pattern (0, 0).

If it is determined that the data including the bits CSB_1 and QSB need to be encoded (Y) in the first encoding-required determination operation S301, the first encoding operation S311 may be performed. If it is determined that the data including the bits CSB_1 and QSB do not need to be encoded (N) in the first encoding-required determination operation S301, the second encoding-required determination operation S401 may be performed.

The first encoding operation S311 may include an operation of encoding the data including the bits MSB and QSB, among the 5-bit conversion data. For example, the first encoding operation S311 may include an operation of inverting the bits MSB and QSB of the 5-bit conversion data.

The first inversion operation S321 may include an operation of inverting the bit CSB_0 of the 5-bit conversion data. Through the first inversion operation S321, information indicating that the data including the bits CSB_1 and QSB to be programmed into the first memory cell (i.e., the odd plug cell) have been encoded may be included in the data including the bit CSB_0 to be stored in the second memory cell (i.e., the even plug cell).

The second encoding-required determination operation S401 may include an operation of determining whether the data including the bits CSB_0 and MSB, among the 5-bit conversion data, need to be encoded. For example, the second encoding-required determination operation S401 may include an operation of determining whether the bits CSB_0 and MSB of the 5-bit conversion data correspond to the program inhibition data pattern (0, 0).

If it is determined that the data including the bits CSB_0 and MSB, among the 5-bit conversion data, need to be encoded (Y) in the second encoding-required determination operation S401, the second encoding operation S411 may be performed.

The second encoding operation S411 may include an operation of encoding the data including the bits MSB and QSB of the 5-bit conversion data. For example, the second encoding operation S411 may include an operation of inverting the bits MSB and QSB of the 5-bit conversion data.

The second inversion operation S421 may include an operation of inverting the bit CSB_1 of the 5-bit conversion data. Through the second inversion operation S421, information indicating that the data including the bits CSB_0 and MSB to be programmed into the second memory cell (i.e., the even plug cell) have been encoded may be included in the bit CSB_1 to be stored in the first memory cell (i.e., the odd plug cell).

Figure 11:
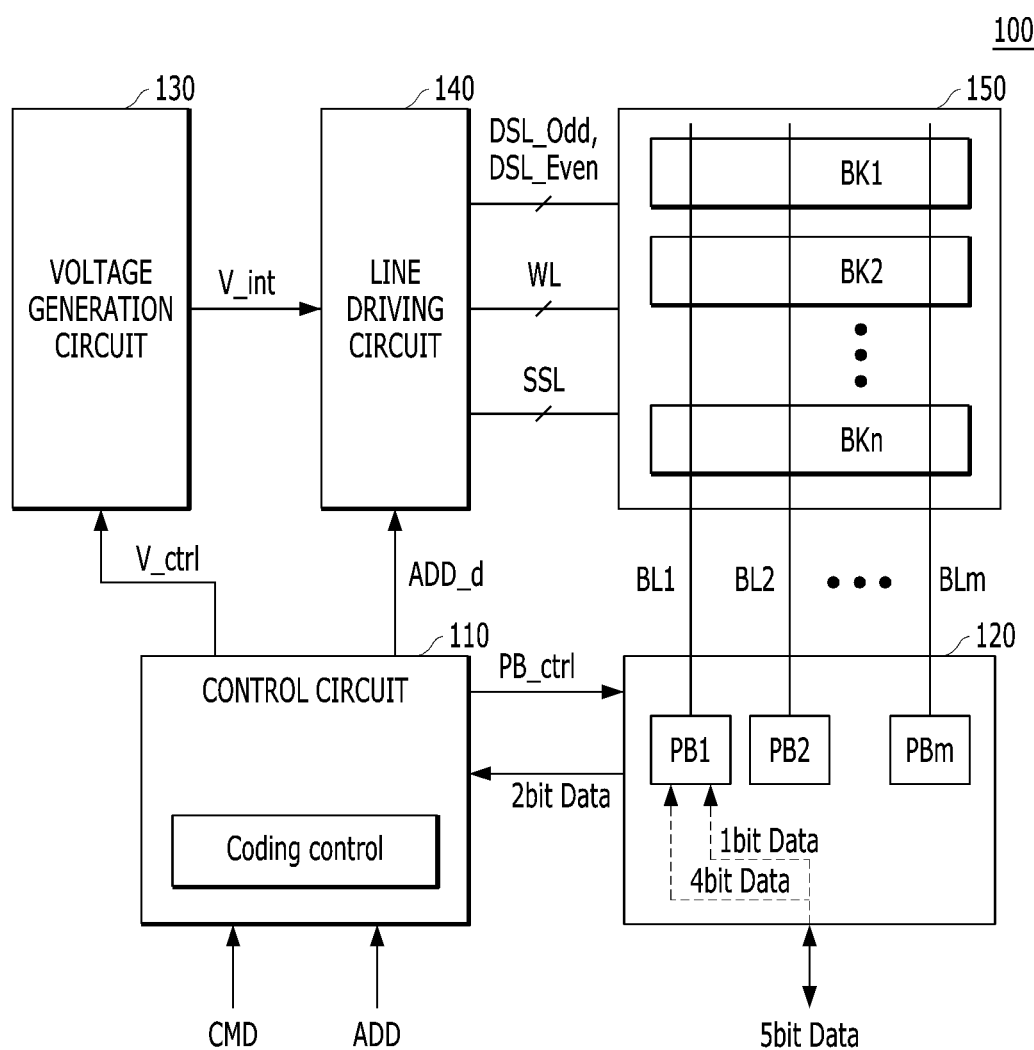
FIG. 11 is a block diagram of a semiconductor device according to an embodiment of the present disclosure.

FIG. 11 is a block diagram of a semiconductor device 100 according to an embodiment of the present disclosure.

Referring to FIG. 11, the semiconductor device 100 may include the control circuit 110, a page buffer group 120, a voltage generation circuit 130, a line driving circuit 140, and a memory cell array 150.

The control circuit 110 may program 5-bit data that are received from the outside into the pair of memory cells that is included in the memory cell array 150 by distributing the 5-bit data, through control of the page buffer group 120, the voltage generation circuit 130, and the line driving circuit 140.

The control circuit 110 may generate a page buffer control signal PB_ctrl, based on a command signal CMD and an address signal ADD that are received from the outside (e.g., a host), and may provide the page buffer control signal PB_ctrl to the page buffer group 120. Furthermore, the control circuit 110 may generate the page buffer control signal PB_ctrl, based on 2-bit data that are provided by page buffers PB1, PB2 to PBm, and may provide the page buffer control signal PB_ctrl to the page buffer group 120.

The control circuit 110 may generate a voltage control signal V_ctrl based on the command signal CMD, and may provide the voltage control signal V_ctrl to the voltage generation circuit 130.

The control circuit 110 may generate a driving address signal ADD_d based on the command signal CMD and the address signal ADD, and may provide the driving address signal ADD_d to the line driving circuit 140.

The page buffer group 120 may include the plurality of page buffers PB1, PB2 to PBm. The plurality of page buffers PB1, PB2 to PBm may be connected to a plurality of bit lines BL1, BL2 to BLm, respectively, where m is a natural number. Each of the plurality of bit lines BL, BL2 to BLm may be connected to at least a pair of memory cells. Each of the plurality of page buffers PB1, PB2 to PBm may include a plurality of latches. Each of the plurality of page buffers PB1, PB2 to PBm may store data in the plurality of latches based on the page buffer control signal PB_ctrl, and may maintain or invert the stored data. Furthermore, each of the plurality of page buffers PB1, PB2 to PBm may program, into the pair of memory cells, the data that have been stored in the plurality of latches through the bit line BL. Furthermore, each of the plurality of page buffers PB1, PB2 to PBm may sense the data that have been programmed into the pair of memory cells, may store the sensed data, and may output the stored sensed data. Accordingly, each of the plurality of page buffers PB1, PB2 to PBm may store data that has been received from the outside, may encode the stored data by inverting at least one bit data of the stored data based on the page buffer control signal PB_ctrl, and may program the data into the pair of memory cells by distributing the data, under the control of the control circuit 110. Furthermore, each of the plurality of page buffers PB1, PB2 to PBm may sense the data that have been stored in the pair of memory cells, may store the sensed data, may decode the stored sensed data by inverting at least one bit data of the stored sensed data based on the page control signal PB_ctrl, and may output the decoded data, under the control of the control circuit 110.

The voltage generation circuit 130 may generate internal voltages V_int having various voltage levels, based on the voltage control signal V_ctrl, and may provide the internal voltages V_int to the line driving circuit 140.

The line driving circuit 140 may drive first drain selection lines DSL_Odd, second drain selection line DSL_Even, word lines WL, and source selection lines SSL to the voltage levels of the internal voltages V_int, based on the driving address signal ADD_d.

The memory cell array 150 may include a plurality of memory blocks BK1, BK2 to BKn, where n is a natural number. Each of the plurality of memory blocks BK1, BK2 to BKn may be selected by the word lines WL. The memory strings of the selected memory block may be connected to the plurality of page buffers PB1, PB2 to PBm through the bit lines BL1, BL2 to BLm. Furthermore, each of the plurality of memory blocks BK1, BK2 to BKn may include a plurality of memory strings to which a pair of memory cells has been connected in series. Each of the plurality of memory strings may include a drain selection transistor, a source transistor, and a dummy cell, in addition to a pair of memory cells that is connected in series to each string. The drain selection transistor may include first drain selection transistors to which the first drain selection lines DSL_Odd are connected and second drain selection transistors to which the second drain selection lines DSL_Even are connected. Connection of the first drain selection lines DSL_Odd and the first drain selection transistors may select a first memory cell (i.e., the odd plug cell), among the pair of memory cells (i.e., the odd plug cell and the even plug cell). Connection of the second drain selection lines DSL_Even and the second drain selection transistors may select a second memory cell (i.e., the even plug cell), among the pair of memory cells (i.e., the odd plug cell and the even plug cell).

The semiconductor device according to an embodiment of the present disclosure, which has been configured as described above, may store 4-bit original data, among 5-bit original data that are received from the outside, in the page buffer PB. The page buffer PB may convert, into 5-bit conversion data, the 4-bit original data that have been stored in the page buffer PB under the control of the control circuit 110. The page buffer PB may provide the control circuit 110 with 2-bit data, among the 5-bit conversion data. The control circuit 110 may generate the page buffer control signal PB_ctrl for the encoding of the 5-bit conversion data, based on the 2-bit data that are provided by the page buffer PB. The page buffer PB may encode the 5-bit conversion data based on the page buffer control signal PB_ctrl. The page buffer PB may program 3-bit data, among the 5-bit conversion data on which the encoding has been completed, into one of the pair of memory cells. Furthermore, the page buffer PB may store the remaining 1-bit original data, among the 5-bit original data, and may program the remaining 2-bit data, among the 5-bit conversion data on which the encoding has been completed, and the original 1-bit data into the other of the pair of memory cells.

Although embodiments according to the technical spirit of the present disclosure have been described above with reference to the accompanying drawings, the embodiments have been provided to merely describe embodiments according to the concept of the present disclosure, and the present disclosure is not limited to the embodiments. A person having ordinary knowledge in the art to which the present disclosure pertains may substitute, modify, and change the embodiments in various ways without departing from the technical spirit of the present disclosure written in the following claims. Such substitutions, modifications, and changes may be said to belong to the scope of the present disclosure. Furthermore, the embodiments may be combined to form additional embodiments.

What is claimed is:

1. A semiconductor device comprising:
   a page buffer comprising first to fifth latches, wherein the first to third latches and the fifth latch are configured to store 4-bit original data, among 5-bit original data, respectively, and the fourth latch is configured to store data identical with the data that has been stored in the second latch; and
   a control circuit configured to determine a) a program inhibition pattern based on data that have been stored in two of the first to fifth latches, b) control the page buffer so that data to be stored in memory cells associated with the page buffer that has been stored in at least one of the first to fifth latches is inverted based on the program inhibition pattern, and c) encode the data in the page buffer including the inverted data and store the encoded data into the memory cells.

2. The semiconductor device of claim 1, wherein:
   the 5-bit original data comprise first to fifth bits, and
   the 4-bit original data comprise the first bit and the third to fifth bits.

3. The semiconductor device of claim 2, wherein:
   the first latch stores the first bit of the 5-bit original data,
   the second and fourth latches store the fourth bit of the 5-bit original data,
   the third latch stores the third bit of the 5-bit original data, and
   the fifth latch stores the fifth bit of the 5-bit original data.

4. The semiconductor device of claim 1, wherein the control circuit inverts or maintains the data that have been stored in the second latch, the third latch, and the fifth latch by determining whether the data that have been stored in the fourth latch and the fifth latch correspond to the program inhibition pattern.

5. The semiconductor device of claim 4, wherein the control circuit inverts the data that have been stored in the second latch, the third latch, and the fifth latch when it is determined that the data that have been stored in the fourth latch and the fifth latch correspond to the program inhibition pattern.

6. The semiconductor device of claim 4, wherein the control circuit maintains the data that have been stored in the second latch, the third latch, and the fifth latch when it is determined that the data that have been stored in the fourth latch and the fifth latch do not correspond to the program inhibition pattern.

7. The semiconductor device of claim 4, wherein the control circuit programs, into one of a pair of memory cells, the data that have been stored in the first to third latches.

8. The semiconductor device of claim 1, wherein the control circuit inverts or maintains the data that have been stored in the third to fifth latches by determining whether the data that have been stored in the second latch and the third latch correspond to the program inhibition pattern.

9. The semiconductor device of claim 8, wherein the control circuit inverts the data that have been stored in the third to fifth latches when it is determined that the data that have been stored in the second latch and the third latch correspond to the program inhibition pattern.

10. The semiconductor device of claim 9, wherein the control circuit maintains the data that have been stored in the third to fifth latches when it is determined that the data that have been stored in the second latch and the third latch do not correspond to the program inhibition pattern.

11. The semiconductor device of claim 8, wherein the control circuit programs, into one of a pair of memory cells, the data that have been stored in the first to third latches, and then stores, in the third latch, remaining 1-bit original data except for the 4-bit original data, among the 5-bit original data.

12. The semiconductor device of claim 11, wherein the control circuit programs, into the other of the pair of memory cells, the data that have been stored in the third to fifth latches.

13. An operating method of a semiconductor device, comprising:
   receiving at an input and output circuit of the semiconductor device 4-bit original data, among 5-bit original data;
   encoding using a page buffer of the semiconductor device under control of a control circuit of the semiconductor device the 4-bit original data into 5-bit conversion data by inclusion of an additional bit, copied from one bit of the 4-bit original data, into the 4-bit original data;
   programming using the page buffer under control of the control circuit 3-bit conversion data, among the 5-bit conversion data, into a first memory cell;
   receiving at the input and output circuit remaining 1-bit original data, among the 5-bit original data; and
   programming using the page buffer under control of the control circuit remaining 2-bit conversion data and the remaining 1-bit original data, among the 5-bit conversion data, into a second memory cell.

14. The method of claim 13, wherein the encoding of the 4-bit original data into the 5-bit conversion data comprises:
   converting the 4-bit original data into the 5-bit conversion data, and
   encoding the 5-bit conversion data.

15. The method of claim 14, wherein the encoding of the 4-bit original data into the 5-bit conversion data comprises generating the 5-bit conversion data including the 4-bit original data and 1-bit additional data, and
wherein the 1-bit additional data is the same data as a specific bit of the 4-bit original data.

16. An operating method of a semiconductor device, comprising:
receiving at an input and output circuit of the semiconductor device 4-bit original data, among 5-bit original data;
converting using a page buffer of the semiconductor device under control of a control circuit of the semiconductor device the 4-bit original data into 5-bit conversion data including a) 2-bit conversion data having a same bit value as one bit of the 4-bit original data and b) remaining 3-bit conversion data having same bit values as remaining bits of the 4-bit original data
programming using the page buffer of the semiconductor device under control of the control circuit of the semiconductor device the 5-bit conversion data into a pair of memory cells;
determining by the control circuit whether the remaining 3-bit conversion data have been encoded based on a value of the 2-bit conversion data;
determining by the control circuit whether the 2-bit conversion data have been encoded based on the value of the 2-bit conversion data, among the remaining 3-bit conversion data,
decoding using the page buffer circuit control of the control circuit the 5-bit conversion data programmed in the pair of memory cells; and
transferring the decoded 5-bit conversion data to a host.

17. The method of claim 16, wherein:
the 5-bit original data comprise first to fifth bits, and
the 4-bit original data comprises the first bit and third to fifth bits of the 5-bit original data.

18. The method of claim 17, wherein the converting of the 4-bit original data into the 5-bit conversion data comprises generating the second bit and fourth bit of the 5-bit conversion data which have the same value as the fourth bit of the 5-bit original data.

19. The method of claim 16, wherein:
the 5-bit conversion data comprise first to fifth bits, and
the determining of whether the remaining 3-bit conversion data have been encoded based on the 2-bit conversion data comprises:
determining whether the first bit and second bit of the 5-bit conversion data correspond to a program inhibition pattern,
encoding the first bit and third bit of the 5-bit conversion data when it is determined that the first bit and second bit of the 5-bit conversion data correspond to the program inhibition pattern, and
inverting the fourth bit of the 5-bit conversion data when it is determined that the first bit and second bit of the 5-bit conversion data correspond to the program inhibition pattern.

20. The method of claim 19, further comprising programming the first to third bits, among the 5-bit conversion data, into one of a pair of the memory cells.

21. The method of claim 16, wherein:
the 5-bit conversion data comprise first to fifth bits, and
the determining of whether the 2-bit conversion data have been encoded based on the 2-bit data comprises:
determining whether the third bit and fourth bit of the 5-bit conversion data correspond to a program inhibition pattern,
encoding the first bit and third bit of the 5-bit conversion data when it is determined that the third bit and fourth bit of the 5-bit conversion data correspond to the program inhibition pattern, and
inverting the second bit of the 5-bit conversion data when it is determined that the third bit and fourth bit of the 5-bit conversion data correspond to the program inhibition pattern.

22. The method of claim 21, further comprising programming the fourth and fifth bits, among the 5-bit conversion data, and remaining 1-bit original data except for the 4-bit original data, among the 5-bit original data, in one of a pair of memory cells.

* * * * *